US006576483B1

United States Patent
Chou et al.

(10) Patent No.: US 6,576,483 B1
(45) Date of Patent: Jun. 10, 2003

(54) BACKSIDE CANNELURE TO PROVIDE FOR WAFER SHIFT DETECTION

(75) Inventors: Ching-Hian Chou, Hsin-Chu (TW); Jean-Hur Yuen, Chang-Hua (TW); Tsung-Chi Hsieh, Tamshui (TW); Yung-Kai Lin, Hsin-Chu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/101,909

(22) Filed: Mar. 19, 2002

(51) Int. Cl.[7] ................. H01L 21/00; G01R 31/26; G01B 11/14; B05C 11/00
(52) U.S. Cl. ................. 438/14; 356/614; 438/5; 438/800; 118/690
(58) Field of Search .................... 118/670, 677, 118/690, 50.1, 621, 636, 500, 671; 438/14, 5, 798; 356/670

(56) References Cited

U.S. PATENT DOCUMENTS 3,711,676 A * 1/1973 Witzel ................. 204/225
5,133,284 A * 7/1992 Thomas et al. ......... 118/715
5,695,568 A * 12/1997 Sinha et al. ........... 118/500

\* cited by examiner

*Primary Examiner*—Carl Whitehead, Jr.
*Assistant Examiner*—Craig Thompson
(74) *Attorney, Agent, or Firm*—Tung & Associates

(57) ABSTRACT

A backside cannelure of an electrode to provide for detecting semiconductor wafer shift after the wafer has been positioned over the cannelure of the electrode is disclosed. The wafer has a backside and a proper position over the cannelure. The cannelure exposes the backside of the wafer to a gas piped in through one or more holes of the electrode. The cannelure has a size such that deviation of the wafer from its proper position by more than a threshold partially exposes the cannelure, such that the gas leaks from the cannelure as now partially exposed. A gas flow detector may detect the gas leaking from the cannelure, and provide corresponding detection of the wafer deviating from its proper position.

20 Claims, 4 Drawing Sheets

BACKSIDE CANNELURE TO PROVIDE FOR WAFER SHIFT DETECTION

FIELD OF THE INVENTION

This invention relates generally to electrodes on which semiconductor wafers are clamped and that have cannelures against the backsides of the wafers, and more particularly to using such cannelures to provide for detection of wafer shift of the wafers when the wafers are clamped to the electrodes.

BACKGROUND OF THE INVENTION

Electrodes area used in a variety of different semiconductor fabrication processes. Typically, a semiconductor wafer is clamped to an electrode, and the backside is exposed to a gas, such as helium, through a cannelure, or groove, in the electrode. The gas ensures that there is a uniform thermal media throughout the semiconductor fabrication process being performed. In some semiconductor fabrication processes, the frontside of the clamped semiconductor wafer is exposed to plasma, as is the case in various dry etching semiconductor fabrication processes.

FIG. 1 shows a side cross-sectional view of a typical system 100 in which a semiconductor wafer 112 is clamped to an electrode 106, via a clamp 104. The electrode is situated within a ring 102. The clamp 104 and the ring 102 may have various holes for mounting and other purposes that are not shown in FIG. 1. The cannelure 110, or groove, within the electrode 106, faces the backside of the semiconductor wafer 112. Holes 108 connected to the cannelure 110 allow for a gas to be piped in, and to which the backside of the semiconductor wafer 112 is exposed. On the frontside of the wafer 112, the wafer 112 may be exposed to plasma in certain semiconductor fabrication processes.

A problem that can occur within the system 100 of FIG. 1 is that the semiconductor wafer 112 shifts even though it is clamped by the clamp 104. For instance, the wafer 112 may rotate, change orientation, or tilt, among other different kinds of shifting. Such shifting can likely expose the electrode 106 to the plasma or other material to which the frontside of the wafer 112 is being exposed. This is shown in FIG. 2, which is a top view of the system 100, in which some components of the system 100 have been omitted for illustrative clarity.

In FIG. 2, the semiconductor wafer 112 has rotated to the right within and relative to the clamp 104, as indicated by the arrow 202. Thus, the flat 204 of the semiconductor wafer 112, which should be aligned to the bottom of the clamp 104, over the flat 206 of the electrode 106, has instead rotated to the right. As shown in FIG. 2, this exposes the electrode 106. In the case where the frontside of the wafer 112 has been exposed to plasma, this means that this part of the electrode 106 has also now been exposed to plasma.

Such plasma exposure of the electrode 106, however, can have disadvantageous consequences. Arcing may result, potentially damaging the electrode 106. Furthermore, the arcing may cause undesired particles to be formed on the semiconductor wafer 112, which can decrease semiconductor device yield, and also cause wafer scrap. Wafer scrap and reduced device yield are costly to the semiconductor foundry fabricating the devices, especially when it cannot pass these costs along to the customer.

Therefore, there is a need for semiconductor wafer shift detection when the wafer has been clamped to an electrode having a cannelure that exposes the backside of the wafer to gas. Such detection should be sensitive and fast enough to detect wafer shift before the electrode has a chance to arc, in the case where the frontside of the semiconductor wafer is exposed to plasma. For these and other reasons, there is a need for the present invention.

SUMMARY OF THE INVENTION

The invention relates to a backside cannelure of an electrode to provide for detecting semiconductor wafer shift after the wafer has been positioned over the cannelure of the electrode. The wafer has a backside and a proper position over the cannelure. The cannelure exposes the backside of the wafer to a gas piped in through one or more holes of the electrode. The cannelure has a size such that deviation of the wafer from its proper position by more than a threshold partially exposes the cannelure, such that the gas leaks from the cannelure as now partially exposed. A gas flow detector may detect the gas leaking from the cannelure, and provide corresponding detection of the wafer deviating from its proper position.

Embodiments of the invention provide for advantages over the prior art. Sizing the cannelure so that the cannelure is exposed when the semiconductor wafer deviates from its proper position causes gas to leak through the cannelure. A backside gas flow detector detects this increased flow of gas, such that it can be concluded that the semiconductor wafer has shifted. Power to the electrode can then be disconnected before arcing occurs, preventing damage to the electrode or the semiconductor wafer. That is, the gas detection is fast and sensitive enough to prevent such electrode and/or wafer damage. Still other advantages, aspects, and embodiments of the invention will become apparent by reading the detailed description that follows, and by referring to the accompanying drawings.

DETAILED DESCRIPTION OF THE INVENTION

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Figure 1:
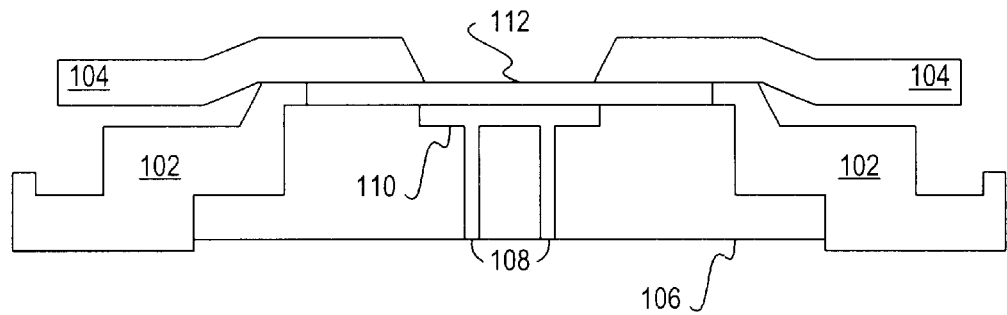
FIG. 1 is a diagram of a side cross-sectional view of a system including a semiconductor wafer clamped over the cannelure of an electrode. The cannelure allows for the backside of the semiconductor wafer to be exposed to a gas, such as helium. The frontside of the semiconductor wafer is not exposed to the gas, and may be separately exposed to plasma. Furthermore, the electrode is not exposed to the plasma when the semiconductor wafer is in its proper position, since it is completely covered by the semiconductor wafer.
Figure 3:
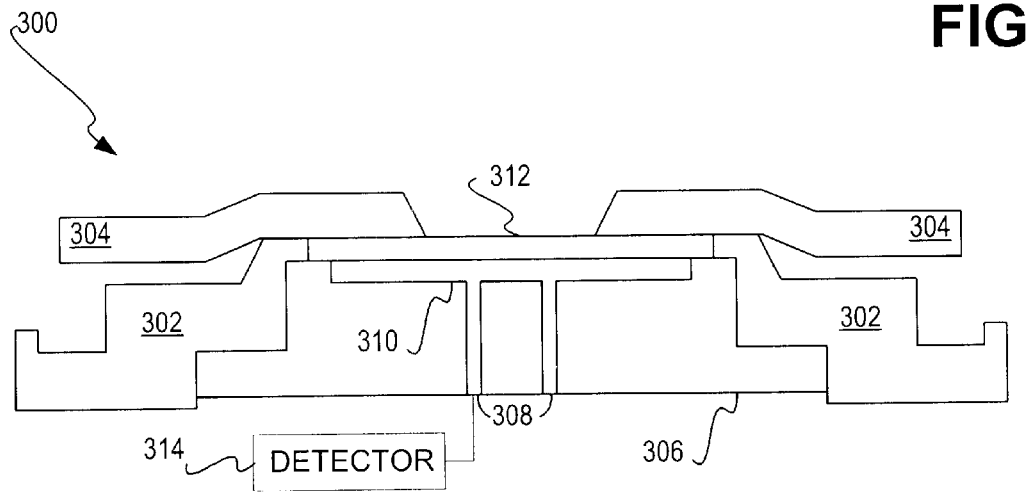
FIG. 3 is a diagram of a side cross-sectional view of a system including a semiconductor wafer clamped over the cannelure of an electrode, according to an embodiment of the invention. The cannelure again allows for the backside of the semiconductor wafer to be exposed to a gas, such as helium. The frontside of the semiconductor wafer is not exposed to the gas when the semiconductor wafer is in its proper position over the cannelure, and may be separately exposed to plasma. The electrode is not exposed to the plasma when the semiconductor wafer is in its proper position, since it is completely covered by the semiconductor wafer.

FIG. 3 shows a side cross-sectional view of a system 300 in which a semiconductor wafer 312 is clamped to an electrode 306, via a clamp 304, according to an embodiment of the invention. The electrode is situated within a ring 302. The clamp 304 and the ring 302 may have various holes for mounting and other purposes that are not shown in FIG. 1. The cannelure 310, or groove, within the electrode 306, faces the backside of the semiconductor wafer 312. Holes 308 connected to the cannelure 310 allow for a gas, such as helium, to be piped in, and to which the backside of the semiconductor wafer 312 is exposed. On the frontside of the wafer 312, the wafer 312 may be exposed to plasma in certain semiconductor fabrication processes. There are preferably four holes 308, where each of the holes 308 shown in FIG. 3 are in line with another hole, so that only two of the holes 308 are shown in FIG. 3. The cannelure 310 has a wider width than the cannelure 110 of FIG. 1.

The semiconductor wafer 312 may shift even though it is clamped by the clamp 304. For instance, the wafer 312 may rotate, change orientation, or tilt, among other different kinds of shifting. Such shifting can likely expose the electrode 306 to the plasma or other material to which the frontside of the wafer 312 is being exposed. However, the cannelure 310 is sized so that if the wafer 312 shifts, or deviates, from its properly aligned position, by more than a predetermined threshold, the cannelure 310 is also exposed. This allows the gas being piped in through the holes 308 to leak out or escape through the cannelure 310. The backside gas flow detector 314 detects this condition, and can perform one or more semiconductor wafer shift detection actions in response, such as sounding an alarm, turning off the electrical power to the electrode 306, and so on. Thus, the detector 314, by detecting the gas leakage, correspondingly detects and concludes that the wafer 312 has shifted by more than a predetermined threshold.

Figure 2:
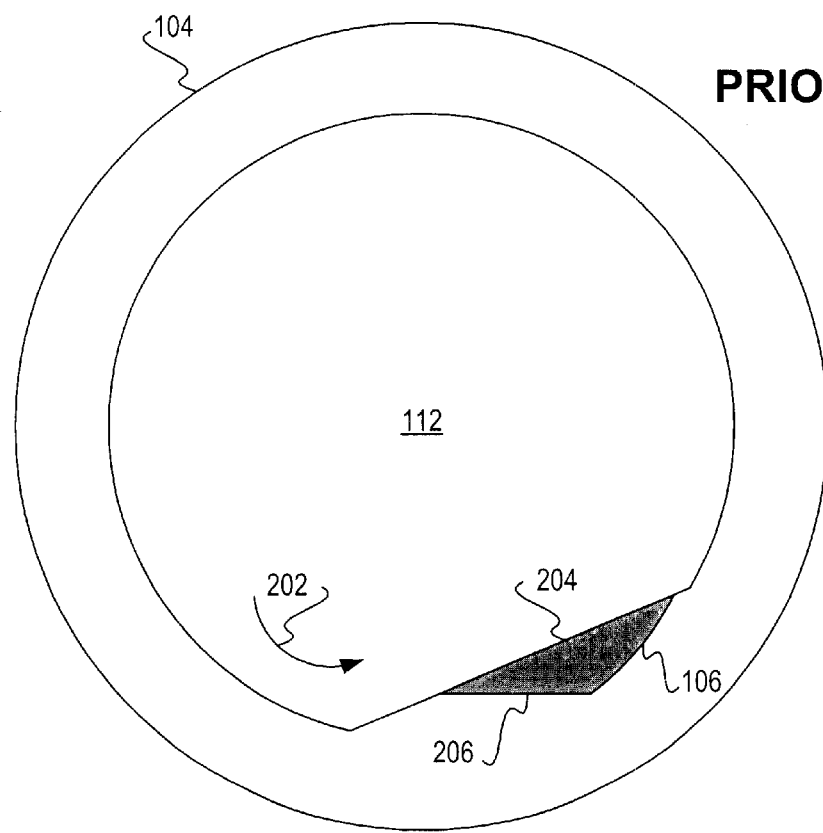
FIG. 2 is a diagram of a top view of the system in FIG. 1, where the semiconductor wafer has shifted or deviated from its proper position over the cannelure of the electrode. As a result, the electrode becomes exposed to the plasma, although the cannelure of the electrode remains unexposed to the plasma, by still being covered by the semiconductor wafer, such that the gas does not escape from the cannelure. The electrode's exposure to the plasma can cause arcing, potentially resulting in damage to the electrode and/or the semiconductor wafer.
Figure 4:
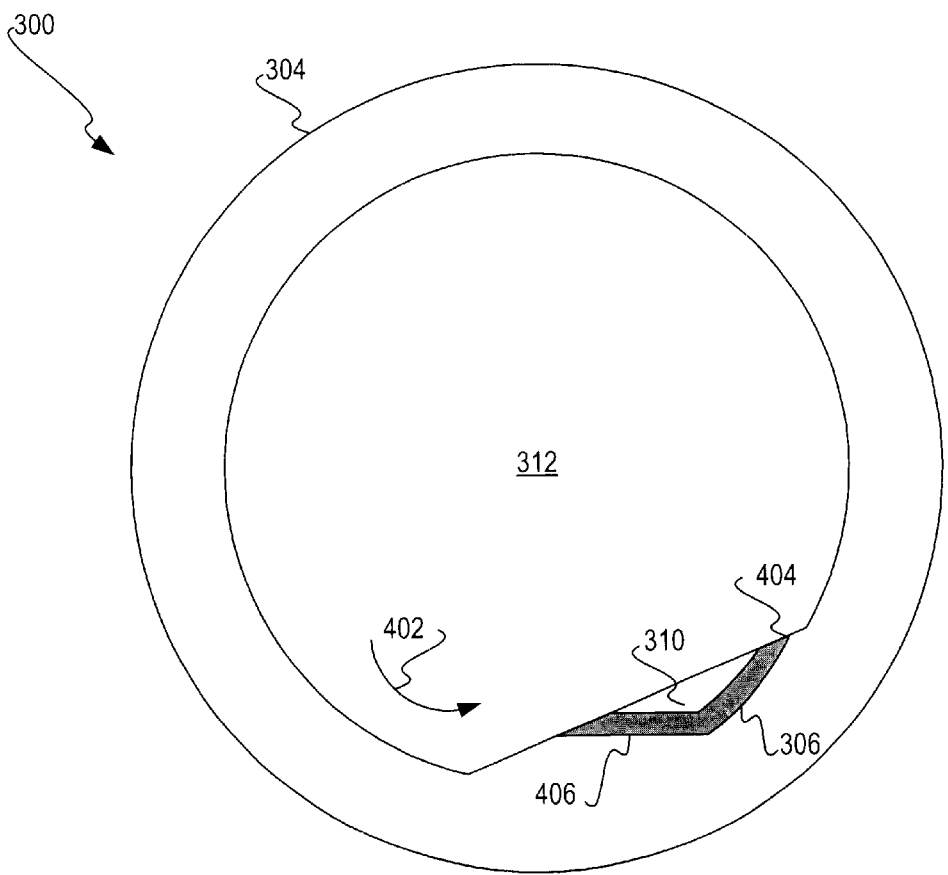
FIG. 4 is a diagram of a top view of the system of FIG. 3, according to an embodiment of the invention, where the semiconductor wafer has shifted or deviated from its proper position over the cannelure of the electrode. The cannelure is sized so that shifting of the semiconductor wafer by more than a threshold from its proper position causes exposure of the cannelure from underneath the semiconductor wafer, in addition to exposure of the electrode. Because the cannelure is exposed, gas escapes or leaks from the cannelure. The detection of this gas flow allows for fast and sensitive detection of the semiconductor wafer shift, before the electrode or the wafer can be damaged from exposure to plasma.

In FIG. 4, a top view of the system 300 is shown, according to an embodiment of the invention in which some components of the system 300 have been omitted for illustrative clarity. The semiconductor wafer 312 has rotated to the right within and relative to the clamp 304, as indicated by the arrow 402. Thus, the flat 404 of the semiconductor wafer 312, which should be aligned to the bottom of the clamp 304, over the flat 406 of the electrode 306, has instead rotated to the right. This exposes the electrode 306, as well as a part of the cannelure 310, in contradistinction to the system 100 in FIG. 2, in which the cannelure 110 is not exposed when semiconductor wafer shift has occurred. The at least partial exposure of the cannelure 310 thus allows the gas to escape or leak from the cannelure 310.

Therefore, the semiconductor wafer 312 deviating from its proper position causes the gas to leak from the cannelure 310. This is because the cannelure 310 becomes exposed when the wafer 312 deviates from its proper position by more than a threshold. The cannelure 310 becomes exposed resulting from its greater size than the cannelure 110 of FIG. 1, which conversely does not become exposed when the semiconductor wafer 112 deviates from its proper position. Detection of the gas leaking provides for detection of the semiconductor wafer 312 deviating from its proper position. This detection can be accomplished in one embodiment by the detector 314. Detection is accomplished, and appropriate actions taken, such as sounding an alarm and/or turning off power to the electrode 306, so that arcing between the electrode and 306 the plasma does not occur, and so that damage does not result to the electrode or the semiconductor wafer 312.

Figure 5:
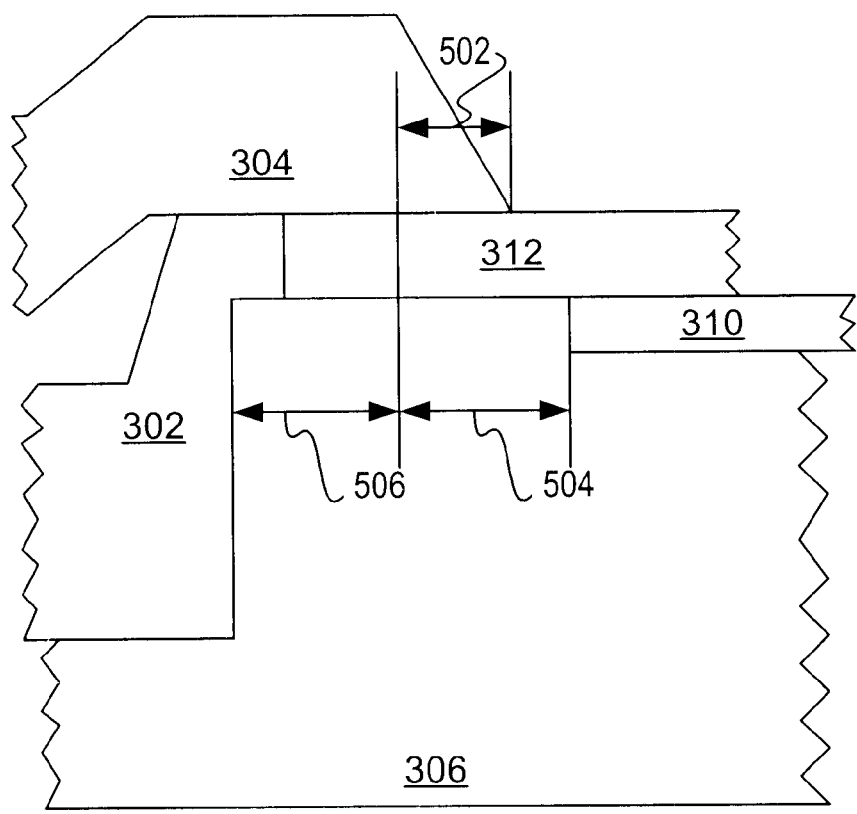
FIG. 5 is a diagram showing one part of the system of FIG. 3 in more detail, according to an embodiment of the invention. The diagram of FIG. 5 shows various measurements of the spacing among the clamp, the semiconductor wafer, the ring, the electrode, and the electrode's cannelure, according to different embodiments of the invention.

FIG. 5 shows a part of the system 300 in more detail, according to an embodiment of the invention, to show particular measurements according to varying embodiments of the invention. The measurements are the measurement 502, between the end of the semiconductor wafer 312 and the end of the clamp 304, the measurement 504, between the end of the wafer 312 and the end of the cannelure 310, and the measurement 506, between the end of the electrode 306 and the end of the wafer 312. In one embodiment, the measurement 502 is 1.75 millimeters (mm), the measurement 504 is 2.0 mm, and the measurement 506 is 1.5 mm. In another embodiment, the measurement 502 is 1.75 mm, the measurement 504 is 3.5 mm, and the measurement 506 is 3.5 mm.

Figure 6:
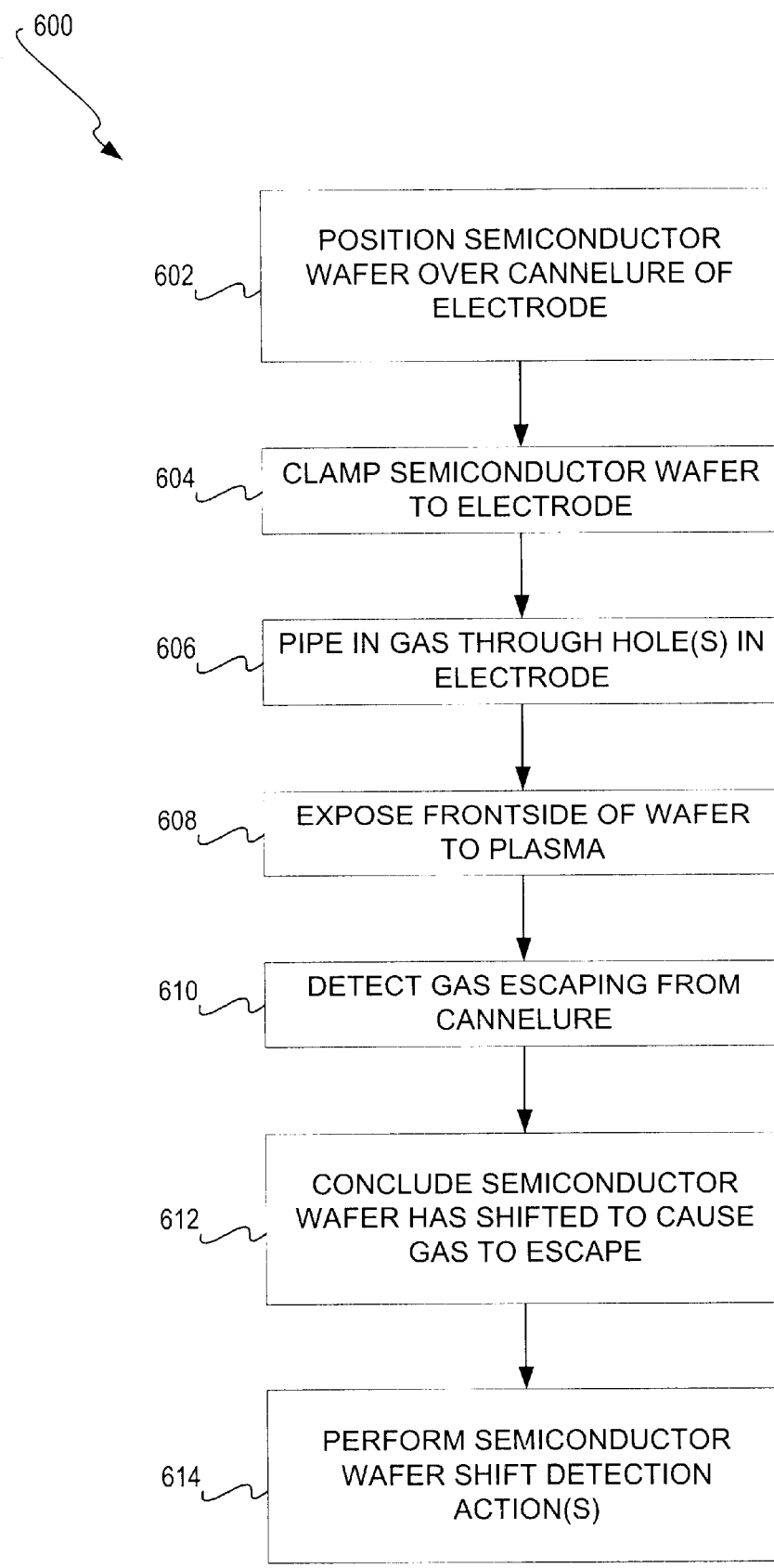
FIG. 6 is a flowchart of a method outlining how a system according to an embodiment of the invention, such as the system of FIG. 3, can detect semiconductor wafer shift, according to an embodiment of the invention. The method of FIG. 6 utilizes gas flow detection as a way to detect whether the semiconductor wafer has shifted from over the cannelure of the electrode, causing exposure of the cannelure.

FIG. 6 shows a method 600 according to an embodiment of the invention, for detecting when a semiconductor wafer has shifted from its proper position, by detecting when gas has escaped from a cannelure exposed due to the semiconductor wafer shift. The method 600 can be performed in conjunction with or by the embodiment of the invention described with reference to the system 300 of FIG. 3. First, the semiconductor wafer is positioned over the cannelure of the electrode (602), within a ring, where the electrode is also situated within the ring, and the wafer is clamped to the electrode (604), with a clamp. Gas is piped in through holes of the electrode that are connected to the cannelure, to expose the backside of the semiconductor wafer to the gas (606). The frontside of the wafer may be exposed to plasma (608).

Normally, when the semiconductor wafer is in its proper position, the gas being piped in through the holes to the cannelure cannot escape, because the semiconductor wafer completely covers the cannelure. However, if the wafer shifts by more than a threshold, then cannelure is no longer completely covered, and the gas escapes. Such leakage or escape of the gas is detected (610), and as a result it is concluded that the semiconductor wafer has shifted to cause the gas to escape (612). One or more semiconductor wafer shift detection action(s) can then be performed (614). For instance, an alarm can sound, power can be disconnected from the electrode, and so on.

It is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

What is claimed is:

1. A system comprising:
    a semiconductor wafer having a backside and a proper position;
    an electrode on which the semiconductor wafer is mounted and having a cannelure facing the backside of the semiconductor wafer, the cannelure exposing the backside of the semiconductor wafer to a gas piped in through one or more holes of the electrode, the cannelure having a size such that deviation of the semiconductor wafer from the proper position by more than a threshold at least partially exposes the cannelure such that the gas leaks from the cannelure; and
    a gas flow detector to detect the gas leaking from the cannelure, and providing for corresponding detection of the semiconductor wafer deviating from the proper position.

2. The system of claim 1, further comprising a clamp to clamp the semiconductor wafer to the electrode.

3. The system of claim 1, further comprising a ring in which the electrode is situated and in which the semiconductor wafer is mounted to the electrode over the cannelure of the electrode.

4. The system of claim 1, wherein the semiconductor wafer further has a frontside exposed to plasma.

5. The system of claim 1, wherein the gas is helium.

6. The system of claim 1, wherein the one or more holes consists essentially of four holes.

7. A system comprising:
    a semiconductor wafer having a backside and that has a proper position;
    an electrode on which the semiconductor wafer is mounted and having a cannelure facing the backside of the semiconductor wafer, the cannelure exposing the backside of the semiconductor wafer to a gas piped in through one or more holes of the electrode, such that the semiconductor wafer deviating from the proper position causes the gas to leak from the cannelure as the cannelure becomes exposed upon the semiconductor wafer deviating from the proper position, detection of the gas leaking providing for detection of the semiconductor wafer deviating from the proper position.

8. The system of claim 7, further comprising a clamp to clamp the semiconductor wafer to the electrode.

9. The system of claim 7, further comprising a ring in which the electrode is situated and in which the semiconductor wafer is mounted to the electrode over the cannelure of the electrode.

10. The system of claim 7, further comprising a backside gas flow detector to detect the gas leaking from the cannelure.

11. The system of claim 7, wherein the semiconductor wafer further has a frontside exposed to plasma.

12. The system of claim 7, wherein the gas is helium.

13. The system of claim 7, wherein the one or more holes consists essentially of four holes.

14. A method comprising:
    positioning a semiconductor wafer over a cannelure of an electrode, the cannelure of the electrode exposing a backside of the semiconductor wafer to gas;
    detecting the gas escaping from the cannelure resulting from exposure of the cannelure upon the semiconductor wafer shifting from a proper position over the cannelure of the electrode; and
    in response to detecting the gas escaping, concluding that the semiconductor wafer has shifted from the proper position over the cannelure of the electrode.

15. The method of claim 14, wherein positioning the semiconductor wafer over the cannelure of the electrode comprises positioning the semiconductor wafer within a ring over the cannelure of the electrode, the electrode also situated within the ring.

16. The method of claim 14, further comprising, after positioning the semiconductor wafer over the cannelure of the electrode, clamping the semiconductor wafer to the electrode with a clamp.

17. The method of claim 14, further comprising, after positioning the semiconductor wafer over the cannelure of the electrode, piping in the gas through one or more holes in the cannelure of the electrode, to expose the backside of the semiconductor wafer to the gas.

18. The method of claim 14, further comprising exposing a frontside of the semiconductor wafer to plasma.

19. The method of claim 14, further comprising, in response to detecting the gas escaping, performing one or more semiconductor wafer shift detection actions.

20. The method of claim 14, further comprising, in response to detecting the gas escaping, sounding an alarm.

* * * * *